(12) United States Patent
Barghi

(10) Patent No.: US 9,900,117 B2
(45) Date of Patent: Feb. 20, 2018

(54) COMMUNICATION UNIT RECEIVER, INTEGRATED CIRCUIT AND METHOD FOR ADC DYNAMIC RANGE SELECTION

(71) Applicant: FREESCALE SEMICONDUCTOR, INC., Austin, TX (US)

(72) Inventor: Frederic Georges-Ferdinand Barghi, Le Rouret (FR)

(73) Assignee: NXP USA, Inc., Austin, TX (US)

(*) Notice: Subject to any disclaimer, the term of this patent is extended or adjusted under 35 U.S.C. 154(b) by 0 days.

(21) Appl. No.: 15/342,274

(22) Filed: Nov. 3, 2016

(65) Prior Publication Data

US 2017/0346579 A1    Nov. 30, 2017

(30) Foreign Application Priority Data

May 27, 2016   (EP) .................................... 16305622

(51) Int. Cl.
| | |
|---|---|
| H03K 9/00 | (2006.01) |
| H04L 27/06 | (2006.01) |
| H04L 27/14 | (2006.01) |
| H04L 27/22 | (2006.01) |
| H04B 17/336 | (2015.01) |
| H04B 17/20 | (2015.01) |
| H04L 27/00 | (2006.01) |
| H04L 1/00 | (2006.01) |
| H04L 27/26 | (2006.01) |

(52) U.S. Cl.
CPC ........... *H04B 17/336* (2015.01); *H04B 17/20* (2015.01); *H04L 1/0003* (2013.01); *H04L 1/0009* (2013.01); *H04L 27/0008* (2013.01); *H04L 27/2662* (2013.01)

(58) Field of Classification Search
CPC .... H04B 17/336; H04B 17/20; H04B 1/0003; H04B 7/0417; H04L 27/0008; H04L 1/0003; H04L 1/0009; H04L 27/2662
USPC ............................... 375/316, 377; 455/343.2
See application file for complete search history.

(56) References Cited

U.S. PATENT DOCUMENTS

| | | | |
|---|---|---|---|
| 7,295,645 B1 | 11/2007 | Ei-Ghoroury et al. | |
| 8,335,484 B1* | 12/2012 | Arad .................... | H04B 1/0003 455/343.2 |
| 2011/0228835 A1* | 9/2011 | Sakai ................... | H04B 7/0417 375/227 |

* cited by examiner

*Primary Examiner* — Phuong Phu

(57) ABSTRACT

A communication unit receiver comprising: a multi-section analog to digital converter, ADC, configured to receive an analog signal and convert at least a first portion of the analog signal into a digital signal using a first ADC dynamic range. A modem, coupled to the multi-section ADC, is configured to: process the digital signal; determine a signal-to-noise ratio, SNR, for sub-carriers of the analog signal; and output an ADC selection signal to the multi-section ADC that selects a subset of sections of the multi-section ADC, where the selection signal is based at least partly on the determined SNR. Only the subset of sections of the multi-section analog to digital converter, ADC is configured to convert a second portion of the analog signal into a digital signal using a second ADC dynamic range that is less than the first dynamic range.

18 Claims, 6 Drawing Sheets

COMMUNICATION UNIT RECEIVER, INTEGRATED CIRCUIT AND METHOD FOR ADC DYNAMIC RANGE SELECTION

FIELD

The field of the invention relates to a communication unit receiver, integrated circuit and a method for analogue to digital converter (ADC) dynamic range selection. The invention is applicable to, but not limited to, active and dynamic selection of an ADC dynamic range using processed data from received orthogonal frequency division multiplex (OFDM) signals.

BACKGROUND

A typical wireless communication receiver includes a down converter stage in order to translate a received radio frequency carrier signal to an intermediate frequency (IF) signal and thereafter (or direct) to a baseband signal. Many current wireless communication systems employ digital technology, which introduces complexity into the receiver's down converter stage, whereby an input radio frequency signal is divided and multiplied by a local oscillator signal and a quadrature version of the local oscillator signal. The resulting outputs are known as the in-phase (I) and quadrature (Q) components. Filtering and amplification in the analogue stages typically precede analogue to digital conversion and subsequent filtering and amplification in the digital domain.

A recent development in wireless communications has introduced short-range wireless capabilities to wireless communication units, e.g. Bluetooth™ and WiFi™. For example, the Internet of Things (IoT) market is a booming technology area investigating Wi-Fi™ technology for many low power consumption products.

Most radio architectures that use digital modulation schemes require two analogue to digital converters (ADCs) in the receive path to convert respective quadrature (I and Q) signals. In radio frequency (RF) transceivers operating in receive mode, a large part of the overall current consumption is used by the ADCs to convert the quadrature 'I' and 'Q' signals from the analogue to the digital domain.

To address such problems associated with ADCs, architectures for implementing scalable resolution A/D converters and architectures for controlling dynamic ranges of an A/D converter have been investigated. For example, in U.S. Pat. No. 7,295,645 B1, a mechanism for dynamic selection of an ADC dynamic range using solely power is proposed.

Architectures and circuits and methods for improving the performance, and reducing the current consumption, of ADCs would therefore be useful.

SUMMARY

The present invention provides a communication unit receiver, an integrated circuit and a method for dynamically selecting an ADC dynamic range, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Figure 1:
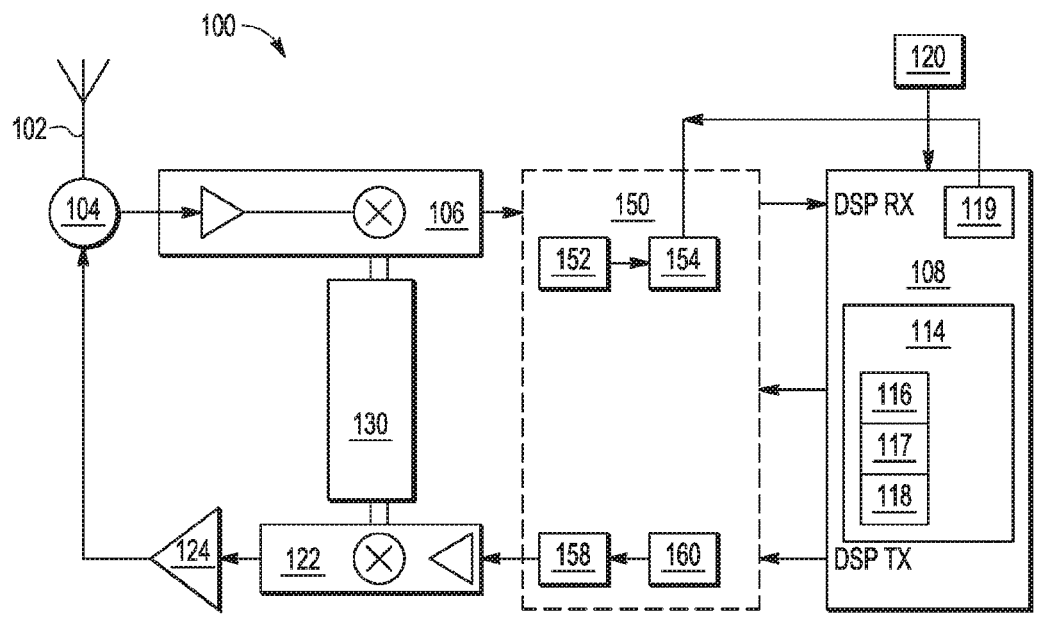
FIG. 1 illustrates a simplified example block diagram of a wireless communication unit, adapted according to example embodiments of the invention.

Examples of the present invention provide a communication unit receiver including: a multi-section analogue to digital converter, ADC, configured to receive an analogue signal and convert at least a first portion of the analogue signal into a digital signal using a first ADC dynamic range. A modem, coupled to the multi-section ADC, is configured to: process the digital signal to determine a signal-to-noise ratio, SNR, for sub-carriers of the analogue signal; and output an ADC selection signal to the multi-section ADC that selects a subset of sections of the multi-section ADC, where the selection signal is based at least partly on the determined SNR. Only the subset of sections of the multi-section analogue to digital converter, ADC is configured to convert a second portion of the analogue signal into a digital signal using a second ADC dynamic range that is less than the first dynamic range.

In this manner, examples of the present invention propose architectures and methods that use information extracted from a digital modem processing a received signal. Examples of the present invention propose to assess a signal-to-noise ratio (SNR) of each of multiple sub-carriers, in contrast to assessing the overall signal strength, in order to take into account channel propagation effects on sub-carriers. In particular, the SNR of each of multiple sub-carriers is calculated to identify an increase in a sub-carrier signal to ADC quantization (noise) ratio, SQR, requirement for each sub-carrier. Based on this information, a determination is made as to how many ADCs from a multi-section ADC should or could be enabled (or disabled) such that ADC quantization will not impact faded sub-carriers.

Examples of the present invention may be employed for any communication signals using different modulation schemes (for example modulation schemes with different signal-to-noise ratio (SNR) requirements). In some examples, a preamble section of a received packet may be used to extract the information, where the modulation (and SNR requirement) used in the packet of the frame is defined. However, examples of the present invention are described with reference to use with orthogonal frequency division multiplex (OFDM) digital signal. The information is then processed to provide a feedback/control (ADC selection) signal to a multi-section ADC in order to dynamically enable and/or disable individual ADCs. The dynamically enabling and/or disabling of ADCs in a multi-section ADC allows the dynamic range of the whole ADC to be adapted. In some examples, where the information extracted from the communication signal, e.g. from a preamble section, indicates an SNR requirement of that date packet, a signal to quantization ratio (SQR) of the analog-to-digital top cell and a corresponding number of its ADC subsections may be selected based thereon. When employed in communication systems that employ sub-carriers, examples assess the SNR of each sub-carrier. In this manner, by disabling of one or more ADC conversion cells according to a determined allowed quantization error, the current consumption in processing the received signal may be reduced. In some examples of the invention, a determination of MCS and a quantization ratio requirement per (OFDM) sub-carrier is made in order to dynamically enable and/or disable one or more of the individual ADCs in the multi-section ADC.

Some examples of the present invention further provide a method and architecture to change the ADC effective least significant bit (LSB) dynamically on the cyclic prefix section, for example in order to avoid transient settling of the useful part of the OFDM symbol, thereby improving the signal-to-noise ratio (SNR) of the received signal. The cyclic prefix is the first portion (e.g. 800 nsec. or 400 nsec.) of the OFDM symbol (4 us equivalent to 80 samples of 50 nsec.), which is removed in post-processing in order to avoid inter-symbol interference (ISI). The modem can then predict in the time domain when the cyclic prefixes are received and is advantageously able to update the ADC dynamic range in one cyclic prefix of one OFDM symbol in the received packet.

In some examples, the circuit may be implemented using discrete components and circuits, whereas in other examples the circuit may be formed in integrated form in an integrated circuit.

One problem resulting from the use of known quadrature ADCs, particularly multi-section ADCs, as identified and appreciated by the inventor, is that the quadrature ADC signal-to-quantization ratio requirement significantly reduces according to the Modulation and Coding Scheme (MCS) index values of the received signal, from, for example, MCS9 to MCS0. MCS index values can be used in conjunction with channel width values to calculate an available/possible data rate that can be supported in a communication link or communication unit.

For example, the 802.11 standard introduces different type of modulations from binary phase shift keyed (BPSK) where a single bit is mapped per sub-carrier to multiple quadrature amplitude modulation schemes, as illustrated in Table 1.

TABLE 1

| MCS | Modulation | Signal to quantization (dB) required to induce less than 0.1 dB SNR loss |
|---|---|---|
| 0 | BPSK | 18 |
| 7 | 64QAM | 36 |
| 9 | 256QAM | 42 |
| 11 | 1024QAM | 47 |

As illustrated in Table 1, receiving a BPSK (MCS 0) signal requires 18 dB of signal to quantization, in order to produce less than 0.1 dB de-sense performance, whereas receiving a 256QAM (MCS 9) signal requires 8 bits to be mapped per sub-carrier, which induces a strong increase of the signal to noise ratio (SNR) requirement. Thus, receiving a 256QAM (MCS 9) signal requires 42 dB of signal to quantization to produce less than 0.1 dB de-sense performance. Furthermore, the above investigation has shown that up to 24 dB quantization noise increase is possible in MCS0 compared to MCS7. In a case where the modulation (MCS0 or MCS9) used in the packet to be received is unknown, the receiver should a priori keep the signal to quantization ratio high enough in order to demodulate the modulation that requires the more stringent SNR. However, in contrast, if the modulation to be received is known and if the channel propagation is good enough, the SNR requirement can be advantageously reduced by an amount of, in this example, 42 dB-18 dB=24 dB (which relates to 4 bits that can be disabled in a 10-bit ADC used in BPSK, thereby providing a power consumption saving).

Hence, some examples of the invention employ a method and architecture that use a determined knowledge of the SNR requirement for the multi-section ADC, for example by determining the prevailing modulation and coding scheme (MCS) index value of received signals to determine how many ADCs in the multi-section ADC have to be enabled enabled/disabled. The level of the quantization noise is known, as it is relative to the number (N) of bits and the frequency sampling of the ADC:

$$QuantizationNoise \approx \frac{FullSwing\_adc}{2^N} \sqrt{\frac{Freq_{Nyquist\_signal}}{Freq_{Sampling}}} \qquad [1]$$

Some topologies allow a quantization increase by disabling some of the multi-section ADC sections in order to save power. In some examples, a modulation coding scheme and signal strength per OFDM sub-carrier may be used, to dynamically select a dynamic range of an ADC (as compared to U.S. Pat. No. 7,295,645 B1 that proposes dynamic selection of a dynamic range of an ADC solely using power).

In some examples, an ADC least significant bit (LSB) effective update is performed in order to keep a channel response (extracted on the LTFs) unchanged. In some examples, the preamble section used in the packet can be demodulated using a full ADC dynamic range, as well as any symbols used to assess channel conditions. These may be extracted from Long Training Fields of the 802.11agnac standards and can be used to maintain a maximum SNR in the receiver. In such examples, the ADC quantization may then be raised to save power consumption in the data payload of the received packet.

Because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Referring to FIG. 1, an example of a simplified block diagram of a wireless communication unit 100 is illustrated, where the wireless communication unit 100 has been adapted according to example embodiments of the invention. The wireless communication unit 100 includes a receiver and a transmitter, shown as distinct circuits and paths for ease. The wireless communication unit 100 includes an antenna 102 coupled to an isolation component or circuit 104, which may be a duplex filter or antenna switch, which isolates signals between the transmitter and receiver circuits.

One or more receiver chains, as known in the art, include(s) receiver front-end circuitry 106 (effectively providing reception, filtering and intermediate or base-band frequency conversion). In example embodiments, the receiver receives a radio frequency, RF, signal and converts the received RF signal to a digital quadrature received signal. The receiver front end circuit 106, for example, may include a low noise amplifier (LNA) coupled to two frequency down-conversion quadrature mixers. Frequency down-conversion mixers mix the amplified signal from the LNA with quadrature local oscillator signals 'I' and 'Q' received from quadrature local oscillator circuit 130 and output the frequency down-converted quadrature signals to low pass filter(s) (LPFs).

The receiver front end circuit 106 is coupled to a baseband (BB) circuit, which may be in a form of a baseband integrated circuit (BBIC) 150. The BBIC 150 includes receive (RX) IQ channel low path filters 152 and IQ ADCs 154. In this example, IQ ADCs provide IQ analogue to digital conversion of the IQ receive channels and are coupled to a Fast Fourier Transform (FFT) engine (not shown) in digital processing unit 120, in order to demodulate orthogonal frequency division multiplex (OFDM) signals and outputs.

The wireless communication unit 100 includes one or more signal processor 108, which may be of the form of a digital signal processor (DSP). In this example, the signal processor 108 includes a controller 114 that maintains overall operational control of the wireless communication unit 100. The controller 114 is also coupled to the receiver front-end circuitry 106, and BB integrated circuit 150. In some examples, the controller 114 is also coupled to a buffer module 117 and a memory device 116 that selectively stores operating regimes, such as decoding/encoding functions, synchronization patterns, code sequences, equalization, OFDM demodulation with its frequency de-mapping and SNR estimation. In accordance with example embodiments of the invention, the memory device 116 may also store data relating to ADC selection in a multi-section ADC, e.g. MCS index values, minimum SNR targets, ADC QSR requirements, equalized OFDM pilots or packet data unit (PDU) OFDM symbols, etc. A timer 118 is coupled to the controller 114 to control the timing of operations (e.g. transmission or reception of time-dependent signals) within the wireless communication unit 100. In other examples, the signal processor 108 can also be natively found in an OFDM modem.

In a transmitter chain sense, the transmitter includes one or more signal processors 108, which may be of the form of a digital signal processor (DSP), and (in this example) two digital-to-analogue converters (DACs) 160 and anti-aliasing filter 158. Two DACs 160 are required for phase amplitude modulated (PAM) OFDM signals. In this example, that is a Cartesian architecture, as one aim of this architecture is to compensate their relative sampling error. The two DACs perform quadrature conversion of the transmit digital signals to an analogue form, with one DAC dedicated for the quadrature 'Q' and one DAC dedicated for the quadrature 'I'. In this example, BBIC 150 outputs analogue quadrature signals to quadrature frequency up-conversion circuit 122, which contains quadrature up-mixer circuit(s) and may contain amplification and additional filtering circuits. The frequency up-conversion circuit 122 combines the two resultant mixed signals before being input to power amplifier (PA) 124, which amplifies the combined signal prior to transmission. PA 124 outputs the up-converted and amplified transmit signal to isolation component or circuit 104 and thereafter antenna 102. Thus, the transmitter includes at least two DACs 160 arranged to receive a digital quadrature transmit signal and the digital quadrature transmit signal is converted to a RF signal for transmission in the transmitter chain.

A known problem with wireless communication units is the effect of current consumption used by the ADCs to convert the quadrature 'I' and 'Q' signals from the analogue to the digital domain. To address such problems associated with ADCs, architectures for implementing scalable resolution A/D converters and architectures for controlling dynamic ranges of an A/D converter have been investigated.

In accordance with some example embodiments, IQ ADCs 154 are formed from a multi-section analogue to digital converter, ADC, configured to receive an analogue signal and convert a first portion of the analogue signal, e.g. a preamble, into a digital signal using a first ADC dynamic range. In accordance with some example embodiments, signal process 108 or controller 114 further includes a modem 119, coupled to the multi-section ADC, and configured to: process a digital received signal. The modem 119 is configured to determine a modulation coding scheme, MCS, and a carrier signal to ADC quantization ratio, SQR, requirement for the sub-carriers of the analogue signal from the digital received signal. The modem 119 is further configured to output an ADC selection signal to the multi-section ADC that selects a subset of sections of the multi-section ADC, where the selection signal is based at least partly on the determined MCS and ADC SQR requirement. The subset of sections of the multi-section analogue to digital converter, ADC convert a second portion of the analogue signal, e.g. a data payload, into a digital signal using a second ADC dynamic range that is less than the first dynamic range.

In some examples, the modem 119 may include a determination circuit configured to compute an ADC SQR requirement per OFDM sub-carrier. In some examples, a computation of an ADC SQR requirement per (e.g. OFDM) sub-carrier may be performed when employing a maximum ADC dynamic range (that is where LSB is the minimum one and the power consumption of ADCs is operating at a maximum). In some examples, the modem 119 may further include a decoder circuit to identify a minimum quantization ratio requirement per OFDM sub-carrier from the computed values, where the minimum quantization ratio requirement per sub-carrier is used to select which sections of the ADCs of the multi-section ADC to enable or disable. Thus, a signal strength of individual sub-carriers is computed to assess SQR on a sub-carrier basis. The sub-carrier with the minimum signal strength defines the minimum SQR required.

In some examples, the modem 119 is configured to generate and output ADC sections selection signal identifying the minimum SQR requirement per sub-carrier to a time-synchronization circuit, for example contained in timer 118, configured to time synchronize the minimum SQR requirement per sub-carrier to a received OFDM symbol time.

In some examples, the modem 119 is configured to compute an allowed quantization error, for example based on the determined MCS index value, and enable or disable ADC conversion cells according to the determined allowed quantization error. In this manner, the remainder of the received data packet, e.g. the data payload, may be received with a higher LSB (as some ADC stages are disabled/turned 'OFF'). In this manner, disabling of conversion cells according to an allowed quantization error may facilitate a reduction in power consumption.

A skilled artisan will appreciate that the level of integration of receiver circuits or components may be, in some instances, implementation-dependent.

The signal processor module in the transmit chain may be implemented as distinct from the signal processor in the receive chain. Alternatively, a single processor 108 may be used to implement a processing of both transmit and receive signals, as shown in FIG. 1, as well as some or all of the BBIC functions. Clearly, the various components within the wireless communication unit 100 can be realized in discrete or integrated component form, with an ultimate structure therefore being an application-specific or design selection.

Figure 2:
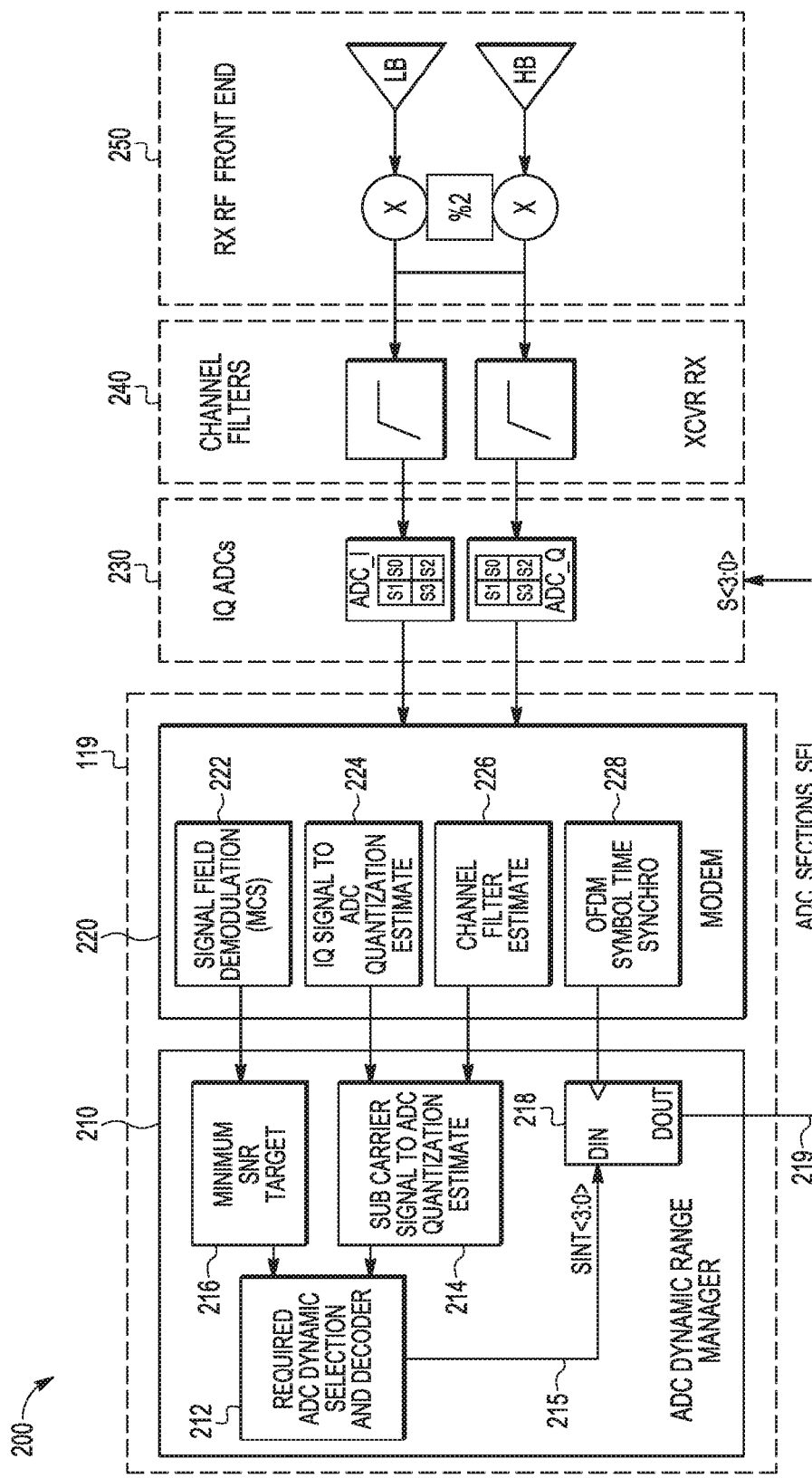
FIG. 2 illustrates a detailed architecture showing functions that support adaptation of ADC dynamic range, according to example embodiments of the invention.

Referring now to FIG. 2, a more detailed example block diagram 200 of a receiver is illustrated. The example block diagram 200 of a receiver describes an ADC dynamic range manager 210, coupled to a receive modem/demodulator 220, coupled to quadrature ADC circuits 230, coupled to channel filters 240 and coupled to receiver radio frequency (RF) front end circuit 250.

In this example, the RF front end circuit 250 includes high-band and low-band RF paths coupled to quadrature down-converter to receive RF signals and produce quadrature baseband signals. The quadrature baseband signals are input to quadrature channel filters 240. The quadrature channel filters 240 output filtered quadrature baseband signals to quadrature ADCs 230, which convert the filtered quadrature baseband signals to digital form.

The digital quadrature baseband signals are input to a modem/demodulator 220, which includes circuits or components or logic (dependent on the specific implementation details) arranged to perform the following functions: a signal field demodulator 222, configured to identify a specific modulation coding scheme (MCS) that is used, a quadrature (IQ) signal-to-ADC quantization requirement 224, a channel filter estimate 226, and an orthogonal frequency division multiplex (OFDM) symbol time synchronization circuit 228. The signal field demodulator 222 based on a specific MCS, quadrature (IQ) signal-to-ADC quantization requirement 224, channel filter estimate 226, and OFDM symbol time synchronization circuit 228 each provide an output signal to an ADC dynamic range manager 210.

In some examples, the ADC dynamic range manager 210 includes circuits or components or logic (dependent on the specific implementation details) arranged to perform one or more of the following functions:

(i) A Minimum signal-to-noise ratio (SNR) Target 216 that is defined by the MCS received from signal field demodulator 222.

(ii) A sub-carrier signal to ADC signal to quantization ratio (SQR) requirement 214, which is calculated simply by using the useful part of the signal, e.g. of quadrature (IQ) signal-to-ADC quantization requirement 224 and from channel filter estimate (equalizer coefficients) 226. Here, any adjacent interferer (non-useful) portion of the received signal is digitally removed.

(iii) The sub-carrier signal to ADC SQR requirement is:

$$SQR_{subCarrier\_K} = \alpha_{subCarrier\_K} \times SQR \quad [2]$$

where: N is the number of sub-carriers,
wherein the normalized channel response coefficient of the Kth sub-carrier is:

$$\alpha_k = \frac{H_k^{LTFRX}}{H_k^{LTFREF}} \times \left| \frac{\sum_n^{Nc} |H_n^{LTFREF}|^2}{\sum_m^{Nc} |H_m^{LTFRX}|^2} \right|^{\frac{1}{2}} \quad [3]$$

A determination circuit 212 in the ADC dynamic range manager 210 receives inputs of the minimum SNR target 216 and the ADC QSR requirement 214. The minimum ADC power of a useful signal is relative to the MCS, which relates to a SNR of the received signal. Based on these inputs, the determination circuit 212 computes a quantization ratio requirement per sub-carrier $SQR_{subCarrier\_K}$. In this manner, the determination circuit 212 is able to take into consideration any fading effect of the received signal. The determination circuit 212 also includes a decoder circuit to identify a minimum ADC QSR requirement per sub-carrier, $Min\{SQR_{subCarrier\_K}\}_{subCarrier_K=1 \text{ to } N'}$ which is used to select the most suitable sections of the ADCs to employ when processing the received signal. For example, in some instances, if $Min\{SQR_{subCarrier\_K}\}_{subCarrier_K=1 \text{ to } N'}$>MinimunSNRTarger (MCS), then the ADC dynamic range can be reduced by the ADC dynamic range manager 210.

In some examples, the determination circuit 212 outputs a signal identifying a minimum ADC SQR requirement per sub-carrier 215 to a time-synchronization circuit 218, which is configured to time synchronize the minimum ADC QSR requirement per sub-carrier 215 to an output of an OFDM symbol time synchronization circuit 228 located in the modem 220. The time-synchronization circuit 218 outputs an ADC section's selection signal 219 that proposes those sections of the quadrature ADC 230 to be used in the processing of the received signal. Advantageously, the ADC section's selection signal 219 is re-synchronized to be effective at the beginning of the cyclic prefix. Applying the ADC section's selection signal 219 in a cyclic prefix of the OFDM symbol may mitigate any ADC transient response (such as potential ADC glitches) due to the dynamic ADC range update, as the section of this prefix cyclic may be discarded by the modem receiver in order to reduce inter symbol interferences.

One example of the benefits provided by the concepts described herein is illustrated below in Table 2. Here, it is assumed that the receiver chain exhibits a total analogue gain of 60 dB.

TABLE 2

| Modulation | Antenna power | ADC Power (dBVrms) | ADC full scale SQR (in dB) | ADC mode |
|---|---|---|---|---|
| 64QAM | −75 dBm<br>−88 dBVrms | −28 | +41 | Full scale |
| BPSK | −95 dBm<br>−108 dBVrms | −48 | +21 | Full scale |
| BPSK | −71 dBm<br>−84 dBVrms | −24 | +45 | 4/10 power reduction |
| BPSK | −65 dBm<br>−78 dBVrms | −18 | +51 | 5/10 power reduction |

For example, with a BPSK signal that is received at −65 dBm without quantization noise impact (below 0.1 dB) with 50% power consumption reduction, and maintaining a 10 dB power headroom to avoid any loss of linearity effect, the following improvements were observed. A typical payload current was reduced by 10 mA, as compared to the current consumed with the preamble, which equates to a 30% current reduction of the analogue RX path. Additionally, there was no observed impact on a Wi-Fi channel response, assessed on the long training field (LTF) OFDM symbols by dynamically updating the ADC dynamic range. An absolute level of the ADC dynamic range quantization error was observed to be −69 dBVrms.

Figure 3:
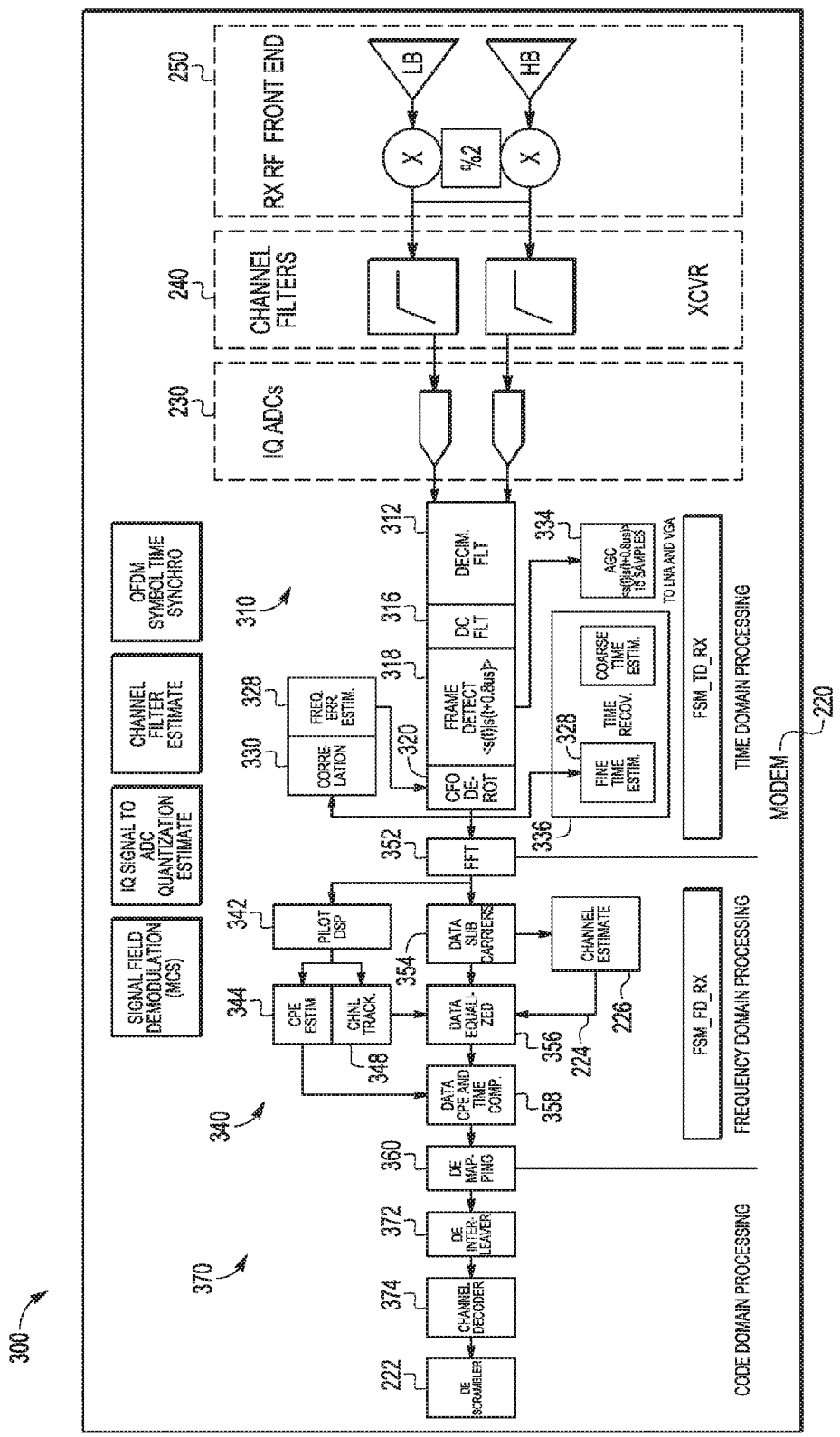
FIG. 3 illustrates a more detailed example block diagram to explain ADC dynamic range manager and inputs from FIG. 2, according to example embodiments of the invention.

Referring now to FIG. 3, a more detailed block diagram of an example modem 220, such as modem 220 of FIG. 2, is illustrated. FIG. 3 illustrates receive modem/demodulator 220, coupled to quadrature ADC circuits 230, coupled to channel filters 240 and coupled to receiver radio frequency (RF) front end circuit 250, in the same manner as described in FIG. 2.

The example block diagram of a receiver describes an ADC dynamic range manager 210, coupled to a. the sections of the modem where the required received signal properties are accessible.

The example modem 220 in receive mode is configured to receive and process an OFDM signal, is used to produce a number OFDM signal properties. The modem 220 includes circuits or components or logic (dependent on the specific implementation details) arranged to perform a number of functions. In this example, the modem (demodulator) 220 functionality, has been divided into time domain processing 310, frequency domain processing 340 and code domain processing 370.

For example, the output from the quadrature ADCs 230 is input to a decimator filter 312 in the time domain processing 310 section, which decimates the digital signal to be simplified before a further decimator filter is configured to produce a quadrature (IQ) signal-to-ADC quantization requirement, such as IQ signal-to-ADC quantization requirement 224 in FIG. 2. In some examples, the ADC IQ signal to quantization noise requirement may be based on useful signal strength over the known quantization level of the ADC 230. A DC filter 316 is then used to remove any residual DC components of the received signal and frame detection 318 and carrier frequency offset de-rotation 320 performed. The frame detection 318 and carrier frequency offset de-rotation 320 utilize the following functions and circuits in time domain processing 310 section, as known in the art: a coarse carrier frequency offset estimation 324, a numerically controlled oscillator and rotor 326, frequency offset estimation 328 and a cross-correlator module circuit 330. The time domain processing 310 section also includes timing recovery 336, as well as analogue and digital automatic gain control (AGC) circuits 334, as known. In accordance with examples of the invention, the timing recovery circuit includes an orthogonal frequency division multiplex (OFDM) symbol time synchronization circuit 228, as described in FIG. 2 and FIG. 4.

The frequency domain processing 340 section includes a fast Fourier transform (FFT) module 352, which produces frequency domain representation of the OFDM received signal samples to a data sub-carriers circuit 354 and a pilot signal digital signal processor 342. The pilot signal digital signal processor 342 provides pilot information to a CPE estimation circuit 344 and a channel tracking circuit 348. The CPE estimation circuit 344 provides a CPE estimate to track for Common Phase Error induced by the frequency synthesizer, which provides a control input to a data CPE and timing compensation circuit 358. In accordance with examples of the invention, an output from the data sub-carriers circuit 354 (from a section of the 802.11abgn/ac preamble known as Long training field (LTFs)), is input to a channel filter estimate circuit 226 to equalize, in equalizer 356, the channel for the symbols following the LTFs and produces quadrature (IQ) signal-to-ADC quantization requirement 224 on a sub carrier basis.

In the code domain processing 370 section, a de-mapping circuit 360 receives and de-maps the output from the data cyclic prefix estimator (CPE) and timing compensation circuit 358. The output from the de-mapping circuit 360 is de-interleaved in de-interleaver circuit 372 and channel decoded in decoder 374. Thereafter, a de-scrambler is configured to perform signal field demodulator 222 and identify a specific modulation coding scheme (MCS) of the signal currently received, a quadrature (IQ) signal-to-ADC quantization requirement 224, a channel filter estimate 226, and an orthogonal frequency division multiplex (OFDM) symbol time synchronization circuit 228. The signal field demodulator 222 based on a specific MCS, quadrature (IQ) signal-to-ADC quantization requirement 224, channel filter estimate 226, and OFDM symbol time synchronization circuit 228 each provide an output signal to an ADC dynamic range manager 210. After the required dynamic ADC range is known, the ADC dynamic selection may be performed by ADC dynamic range manager 210 within a prefix cyclic on one OFDM symbol of the payload, so that noise from electrical transients within the ADC does not impact the SNR of the symbol to be demodulated.

Figure 4:
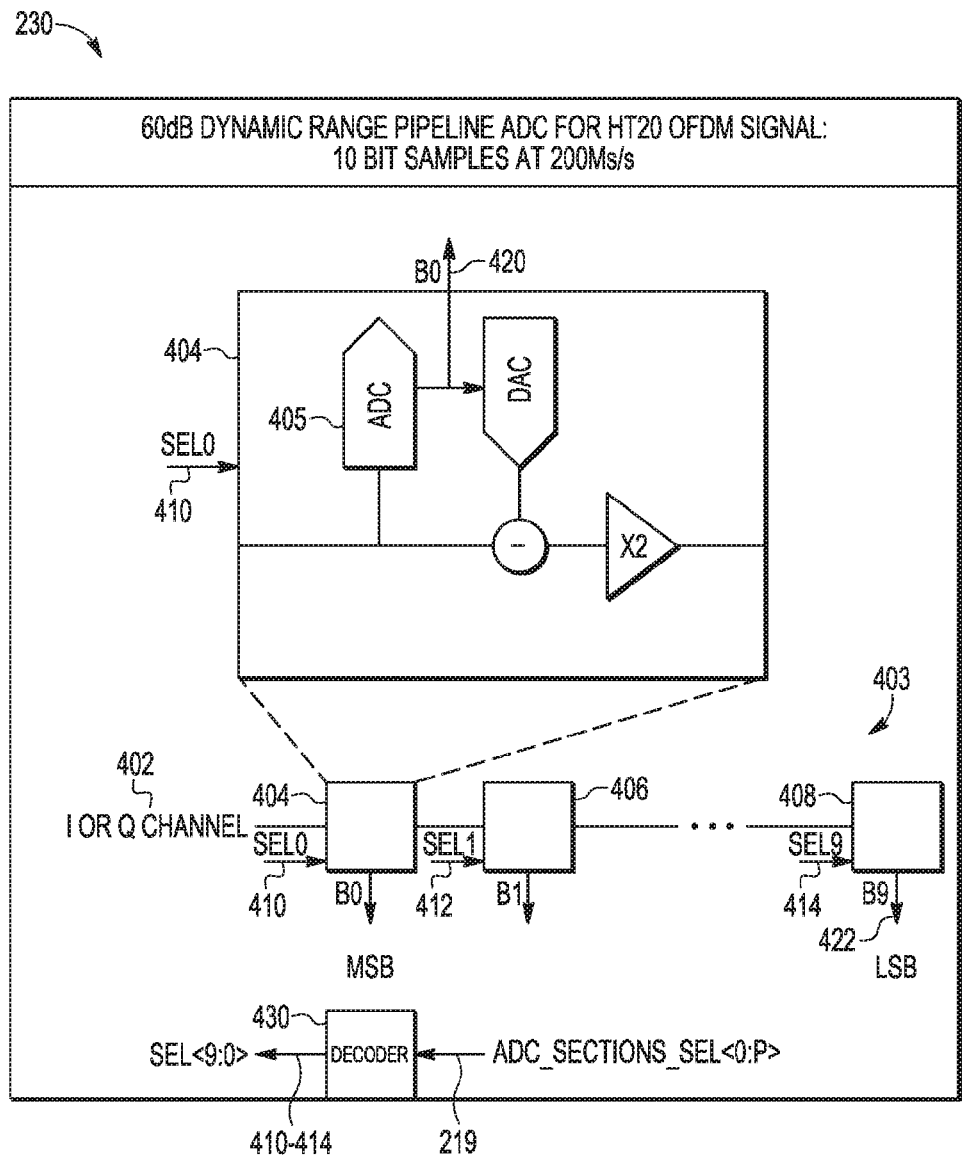
FIG. 4 illustrates an example multi-section ADC that is configured to support dynamic ADC dynamic range updates, according to example embodiments of the invention.

Referring now to FIG. 4, an example multi-section ADC 230 that is configured to support dynamic ADC dynamic range updates is illustrated, according to example embodiments of the invention. In this example, the multi-section ADC 230 is constructed of a 60 dB dynamic range pipeline ADC for HT20 OFDM signals operating at 10 bit samples at 200 Ms/sec.

An OFDM signal is received on either the 'I' channel or 'Q' channel 402 and input to a circuit 404 that includes an ADC 405. A series of ten such circuits 404, 406, . . . 408 are configured in a pipeline arrangement 403. In accordance with examples of the invention, each circuit 404, 406, . . . 408 receives a respective select control signals SEL_0 . . . SEL_9 410, 412, . . . 414 that either enables or disables it's operation. Each ADC 405, if selected by the respective select control signals SEL_0 . . . SEL_9 410, 412, . . . 414, outputs a bit, with the first ADC 405 outputting a most significant bit (MSB) 420 and the last ADC outputting a least significant bit (LSB) 422. A decoder 430 is configured to provide the respective select control signals SEL_0 . . . SEL_9 410, 412, . . . 414 in response to an ADC sections selection signal 219. In this manner, a selectable number of circuits 404, 406, . . . 408 and ADCs 405 may be chosen to process the received OFDM signal The ADC 230 topology shows the processing for the MSB 420 up to the LSB 422. Cells are identical and therefore there is the same power consumption per bit.

According to the SNR required, switches SEL9 to SELx are low disabling their conversion block cells to save power consumption. Removing 'X' LSBs bits over 'Y' bits reduces the overall ADC power consumption by a ratio 'X/Y'. Advantageously, in some examples, any corresponding Wi-Fi Channel response remains unchanged as a result of disabling LSBs, as the transfer function of the channel including any ac response of the ADC has been captured whilst the LTFs were received. The ac response of the MSBs remains unchanged while LSBs are switched off within the multiple ADC structure. Furthermore in some examples, no channel estimation updates are required, which would increase the signal quantization error. Advantageously, in employing a mechanism to selectively enable/disable ADCs in a multi-section ADC 230, no changes in the ADC transfer function as SEL_0 to SEL_y are kept enabled.

It is envisaged that, in other examples, the concept described above may be employed in other ADC architectures, such as a successive approximation register (SAR) based ADC, a Flash ADC, etc.

Figure 5:
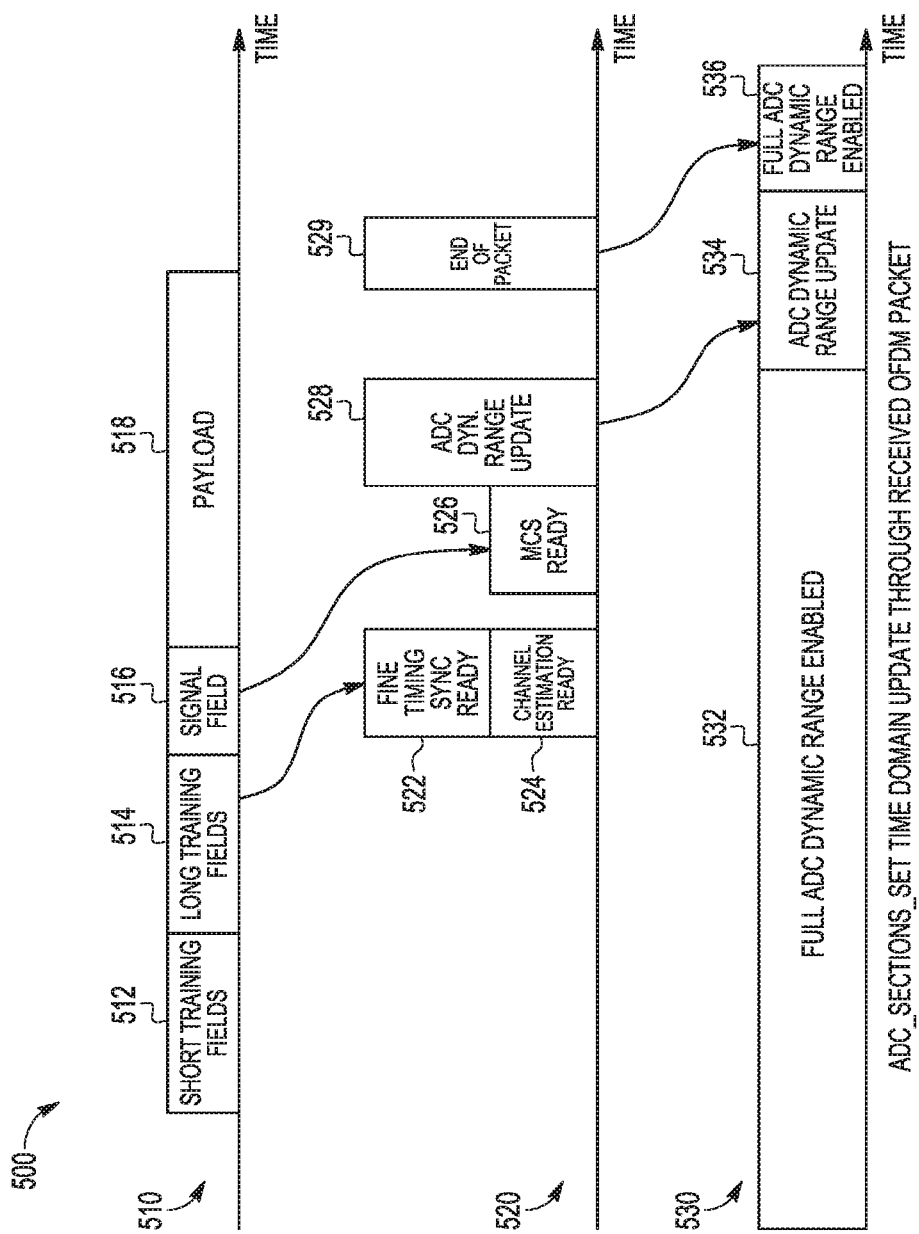
FIG. 5 illustrates an example timing diagram for employing dynamic ADC dynamic range updates, according to example embodiments of the invention.

Referring now to FIG. 5, an example timing diagram 500 for employing dynamic ADC dynamic range updates is illustrated, according to example embodiments of the invention. A first timing diagram 510 illustrates a format of the received OFDM signal. The received OFDM signal includes short training fields 512, followed by long training fields (LTFs) 514, followed by a signal (SIG) field 516 and finally by the data payload 518. A second timing diagram 520 illustrates some examples of where information is obtained to compute how best to perform dynamic ADC dynamic range updates. For example, channel estimation 524 is performed and a fine timing synchronization operation 522 may be performed when LTFs 514 are received. In some examples, a fine timing synchronization operation 522 may be performed when LTFs are received, as this allows a controller/processor/modem to know what is the first sample received of one OFDM symbol. In this example, one OFDM symbol is 80 samples with 64 samples being useful for the demodulation and 16 unused samples to counteract inter-symbol interference (ISI). The MCS 526 is known when SIG field 516 is received. Following the computations as previously described, an update of the ADC dynamic range 528 may be ready.

A third timing diagram 530 illustrates that at a beginning of the preamble, full ADC dynamic range is enabled 532. In this example, an ADC dynamic range is updated at the end of the SIG Symbol (as the MCS is known), at 534. In some examples, the ADC dynamic range may be updated at a first symbol of the data payload. At the end of the packet 529 (known from the SIG symbol/field 516), the full dynamic range 536 is returned. Thus, in some examples, a preamble of a received signal, such as an OFDM received signal, is received using a maximum ADC dynamic range of a multi-section ADC, where the LSB is a minimum one and power consumption of ADCs is at a maximum. The rest of the packet, for example the data payload, is received with an higher LSB (whereby one or more ADC stages is/are switched 'OFF'), thereby reducing the power consumption exhibited by the ADC.

Figure 6:
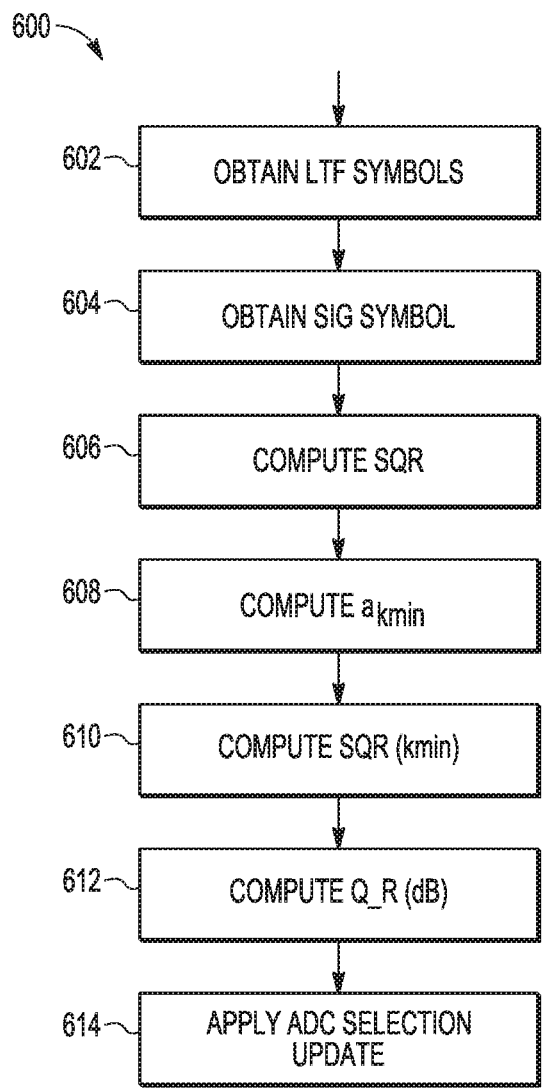
FIG. 6 illustrates an example overview flowchart for employing dynamic ADC dynamic range updates, according to example embodiments of the invention.

Referring now to FIG. 6, an example overview flowchart 600 for employing dynamic ADC dynamic range updates is illustrated, according to example embodiments of the invention. In essence, the method for dynamically selecting an ADC dynamic range includes: converting by a multi-section analogue to digital converter, ADC, a first portion of an analogue signal into a digital signal using a first ADC dynamic range. Thereafter, the method includes processing the digital signal to determine a signal-to-noise ratio, SNR for sub-carriers of the analogue signal; and outputting an ADC selection signal to the multi-section ADC that selects a subset of sections of the multi-section ADC, where the selection signal is based at least partly on the determined SNR; and converting a second portion of the analogue signal into a digital signal using the subset of sections of the multi-section ADC using a second ADC dynamic range that is less than the first dynamic range.

The flowchart commences with a received OFM signal that is processed. From the processed received OFM signal, a channel estimate is performed, that includes computing a normalized channel response, from which LTF OFDM symbols are obtained, as in 602 according to equation [3]. In some examples, this is performed by channel filter estimate 226 from FIG. 2 and FIG. 3.

The processed received OFM signal is then is de-scrambled, to obtain the OFDM signal (SIG) symbol (e.g. from signal field 516 in FIG. 5), as in 604. In some examples, a MCS field may be demodulated and decoded in this step to obtain a minimum SNR target (defined by the MCS received from signal field demodulation). In some examples, this may be obtained following a comparison of measured values with those stored in a look-up table.

In 606 a sub-carrier signal to ADC quantization ratio (SQR) requirement is performed for each OFDM sub-carrier, e.g. in a HTx0 ('x'=2, 4, 8, 16) bandwidth. In some examples, this may be calculated simply by the useful part of the received OFDM signal, e.g. based on a quadrature (IQ) signal-to-ADC quantization requirement 224 and a channel filter estimate 226 from FIG. 2 and FIG. 3. For example, a quantization level (Q_F) is a constant at full ADC dynamic range and a signal ('S') is extracted post channel filtering, such that SQR=S−Q_F.

In 608, a normalized channel response coefficient for each of $K^{th}$ sub carrier is calculated, in order to determine a minimum $a_{kmin}$, where:

$$\alpha_{kmin} = \min\{|\alpha_k|\}_{k=1:Nc} \quad [4]$$

In some examples, this is performed by channel filter estimate 226 from FIG. 2 and FIG. 3.

In 610, using the values calculated from 606 and 608, together with equations [2] and [3], a quantization ratio (SQR) for a minimum $K^{th}$ sub carrier is determined, whereby:

$$SQR(kmin) = SQR + 20 \times \log 10(|\alpha_{kmin}|) \quad [5]$$

In some examples, this is performed by channel filter estimate 226 from FIG. 2 and FIG. 3.

In 612, a ratio is then computed to provide a gain quantization level Q_F that can be increased in order to demodulate correctly the signal according to the channel response:

$$Q\_R = SQR(kmin) - SNR\_TARGET(MCS) \quad [6]$$

In some examples, a LUT is then accessed in order to obtain an indication of the ADC sections to use from the Q_R calculation in equation [6], ADC_SECTION_SEL=LUT(Q_R). Thereafter, the selection signal is then applied to the digital ADC, in 614, for example applied in the cyclic prefix (CP) window, for example employing a 400 nsec or 800 nsec window, and used to counteract inter-symbol interference (ISI).

Although examples of the invention have been described with reference to a quadrature architecture, for example employing multiple quadrature ADCs, it is envisaged that in other examples a single ADC may be employed. Here, in this example, a single ADC may be employed to operate at an intermediate frequency (IF) where quadrature discrimination and IF to ZIF conversion may be performed subsequently in the digital domain.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired sampling error and compensation by operating in accordance with suitable program code, such as minicomputers, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A communication unit receiver comprising:
 a multi-section analogue to digital converter, ADC, configured to receive an analogue signal and convert at least a first portion of the analogue signal into a digital signal using a first ADC dynamic range; and
 a modem, coupled to the multi-section ADC, and configured to:
  process the digital signal to determine a signal-to-noise ratio, SNR, for sub-carriers of the analogue signal, and
  output an ADC selection signal to the multi-section ADC that selects a subset of sections of the multi-section ADC, where the ADC selection signal is based at least partly on the determined SNR, wherein only the subset of sections of the multi-section ADC is configured to convert a second portion of the analogue signal into a digital signal using a second ADC dynamic range that is less than the first dynamic range, and
  a determined SNR for a sub-carrier of the analogue signal comprises a determined carrier ADC signal to quantization ratio, SQR, requirement per sub-carrier.

2. The communication unit receiver of claim 1 wherein a determined SNR for a sub-carrier of the analogue signal is extracted from a preamble of a received packet.

3. The communication unit receiver of claim 2, wherein the at least first portion of the analogue signal is a signal preamble and the second portion is a data payload.

4. The communication unit receiver of claim 3 wherein the signal preamble is received using a maximum ADC dynamic range; and the data payload is received with at least one ADC of the multi-section ADC disabled.

5. The communication unit receiver of claim 1 wherein the determined SNR for the sub-carrier of the analogue signal comprises the determined sub-carrier ADC SQR requirement per sub-carrier and a determined modulation coding scheme, MCS.

6. The communication unit receiver of claim 1 wherein the modem comprises a determination circuit configured to compute an ADC SQR requirement per sub-carrier.

7. The communication unit receiver of claim 6 wherein the determination circuit comprises a decoder circuit to identify a minimum ADC SQR requirement per sub-carrier that is used to select the subset of sections of the multi-section ADC sections identified by the ADC selection signal.

8. The communication unit receiver of claim 7 wherein the determination circuit outputs an ADC selection signal identifying the minimum ADC SQR requirement per sub-carrier to a time-synchronization circuit in the modem configured to time synchronize the ADC SQR requirement per sub-carrier to a received symbol time.

9. The communication unit receiver of claim 8 wherein the ADC selection signal is re-synchronized to be effective at a beginning of a cyclic prefix.

10. The communication unit receiver of claim 9 wherein the cyclic prefix comprises a first portion of an orthogonal frequency division multiplex, OFDM, symbol and the modem is configured to predict in a time domain when cyclic prefixes are received.

11. The communication unit receiver of claim 10 wherein the modem updates the ADC dynamic range in one cyclic prefix of one OFDM symbol in the received packet.

12. The communication unit receiver of claim 10 wherein the modem is configured to perform a channel estimation and timing synchronization operation when long training fields of a received orthogonal frequency division multiplexed, OFDM, signal are processed.

13. The communication unit receiver of claim 1 wherein the modem being configured to determine the SNR for the sub-carriers of the analogue signal comprises the modem being configured to determine an allowed quantization error and to disable at least one ADC section from the multi-section ADC based at least partly on the allowed quantization error.

14. The communication unit receiver of claim 1 wherein the multi-section ADC comprises a plurality of individual ADCs that each have a control input, such that the ADC selection signal individually and independently enables or disables the individual ADCs.

15. The communication unit receiver of claim 1 wherein the multi-section ADC comprises at least one from a group of: a pipeline ADC, a successive approximation register, SAR, based ADC, a Flash ADC.

16. An integrated circuit for a communication unit receiver comprising:
- a multi-section analogue to digital converter, ADC, configured to receive an analogue signal and convert at least a first portion of the analogue signal into a digital signal using a first ADC dynamic range; and
- a modem, coupled to the multi-section ADC, and configured to:
  - process the digital signal to determine a signal-to-noise ratio, SNR, for sub-carriers of the analogue signal, and
  - output an ADC selection signal to the multi-section ADC that selects a subset of sections of the multi-section ADC, where the ADC selection signal is based at least partly on the determined SNR, wherein only the subset of sections of the multi-section ADC are configured to convert a second portion of the analogue signal into a digital signal using a second ADC dynamic range that is less than the first dynamic range, and
  - a determined SNR for a sub-carrier of the analogue signal comprises a determined carrier ADC signal to quantization ratio, SQR, requirement per sub-carrier.

17. The integrated circuit of claim 16 wherein a determined SNR for a sub-carrier of the analogue signal is extracted from a preamble of a received packet.

18. A method for dynamically selecting an ADC dynamic range, the method comprising:
- converting by a multi-section analogue to digital converter, ADC, a first portion of an analogue signal into a digital signal using a first ADC dynamic range;
- processing the digital signal to determine a signal-to-noise ratio, SNR, for sub-carriers of the analogue signal, wherein a determined SNR for a sub-carrier of the analogue signal comprises a determined carrier ADC signal to quantization ratio, SQR, requirement per sub-carrier; and
- outputting an ADC selection signal to the multi-section ADC that selects a subset of sections of the multi-section ADC, where the selection signal is based at least partly on the determined SNR;
- converting a second portion of the analogue signal into a digital signal using the subset of sections of the multi-section ADC using a second ADC dynamic range that is less than the first dynamic range.

* * * * *